(12) United States Patent
Lyne et al.

(10) Patent No.: US 9,312,253 B2
(45) Date of Patent: Apr. 12, 2016

(54) HETEROGENEOUS INTEGRATION OF MEMORY AND SPLIT-ARCHITECTURE PROCESSOR

(71) Applicant: Texas Instruments Incorporated, Dallas, TX (US)

(72) Inventors: Kevin Lyne, Yantis, TX (US); Kurt P. Wachtler, Richardson, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/590,060

(22) Filed: Jan. 6, 2015

(65) Prior Publication Data

US 2015/0111318 A1  Apr. 23, 2015

Related U.S. Application Data

(62) Division of application No. 13/707,219, filed on Dec. 6, 2012, now Pat. No. 8,957,525.

(51) Int. Cl.
| | |
|---|---|
| H01L 21/44 | (2006.01) |
| H01L 25/00 | (2006.01) |
| H01L 25/065 | (2006.01) |
| H01L 25/18 | (2006.01) |
| H01L 23/14 | (2006.01) |
| H01L 23/538 | (2006.01) |
| H01L 21/56 | (2006.01) |
| H01L 23/00 | (2006.01) |
| H01L 23/498 | (2006.01) |

(52) U.S. Cl.
CPC ............. *H01L 25/50* (2013.01); *H01L 21/56* (2013.01); *H01L 23/147* (2013.01); *H01L 23/49827* (2013.01); *H01L 23/5384* (2013.01); *H01L 23/5385* (2013.01); *H01L 24/81* (2013.01); *H01L 25/065* (2013.01); *H01L 25/0652* (2013.01); *H01L 25/18* (2013.01); *H01L 23/49816* (2013.01); *H01L 2224/16225* (2013.01); *H01L 2224/16235* (2013.01); *H01L 2224/81801* (2013.01); *H01L 2225/0652* (2013.01); *H01L 2225/06517* (2013.01); *H01L 2225/06548* (2013.01); *H01L 2924/01322* (2013.01); *H01L 2924/1434* (2013.01)

(58) Field of Classification Search
CPC ..................... H01L 21/76877; H01L 25/0657
USPC ........... 438/109, 629, 637; 257/686, 774, 777
See application file for complete search history.

(56) References Cited

U.S. PATENT DOCUMENTS 7,723,839 B2 *  5/2010  Yano et al. .................... 257/700

* cited by examiner

*Primary Examiner* — Theresa T Doan
(74) *Attorney, Agent, or Firm* — Steven A. Shaw; Frank D. Cimino

(57) ABSTRACT

A method for fabricating a semiconductor device provides a first chip having first terminals, a second chip having second terminals, and a third chip having third terminals. A first silicon interposer having first through silicon vias TSVs and a second silicon interposer having second TSVs is provided. The first TSVs are arrayed in a first, a second, and a third set. The first set is located in a first interposer region and matching the first terminals. The second set is located in a second interposer region and matching the second terminals. The third set is located in a third interposer region between the first and second regions and matching the TSVs of the second interposer and the third terminals. The first chip is aligned with the first set TSVs. The second chip is aligned with the second set TSVs. The second interposer is aligned with the third set TSVs. A solder of a first melting temperature is used.

13 Claims, 3 Drawing Sheets

HETEROGENEOUS INTEGRATION OF MEMORY AND SPLIT-ARCHITECTURE PROCESSOR

CROSS REFERENCE TO RELATED APPLICATIONS

This application is a Divisional of and claims priority to U.S. application Ser. No. 13/707,219, filed Dec. 6, 2012, herein incorporated in its entirety.

FIELD

The embodiments of the invention are related in general to the field of semiconductor devices and processes, and more specifically to the use of two semiconductor interposers for vertically stacking chips with split architecture.

DESCRIPTION OF RELATED ART

Since the invention of the integrated circuit, the course of circuit development was in the direction of combining ever more electronic functions into the circuit layout on a single chip. A well known example is the combination of logic and memory functions on a single chip. The functions are constructed from electrical components such as resistors, capacitors, diodes, and transistors, which in turn are realized by layouts on the chip. Comparing the layouts of contemporary chips it becomes evident that the fabrication of the components for some layouts needs a higher number of process steps than the fabrication of the components for other layouts.

The discrepancy in the number of fabrication steps is aggravated by the persistent trend for more functions on a chip, leading to higher circuit complexity and larger chip sizes, combined with the ongoing market pressure for miniaturization of the components, leading to shrinking feature sizes. Since the market further strongly encourages products of reduced cost and increased reliability, the semiconductor industry started an effort in the last few years to split a single large chip with a complex circuit into a plurality of chips with circuits of closely related features by using as separating lines characteristics such as technology nodes, or number of process steps or photomask steps. As examples, chips may be separated along the technology nodes 28 nm versus the 20 nm, or architectural splits for a system-on-a-chip into logic (for instance wireless lan chip) and memory (for example flash memory chip). Since the flash memory requires several additional photomask, it is more economical to confine the cost adder to just the memory part.

After deciding to split an overly complex chip into a number of more economical chips, a strategy for assembling the chips into a single package has to be developed. For instance, in continuing the above example of an architectural split of a system-on-a-chip, the device may be a packaged chip stack with the wireless lan chip placed as the lower chip of the stack and the flash memory chip as the upper chip; the lower chip is attached to the package substrate with connections to external parts. Wire bonds interconnect the upper chip to the lower chip and the lower chip to the substrate; the unavoidable IR drop caused by the wires has to be taken into account. If a product would try to avoid the use of bonding wires by creating metal-filled vias through the bottom chip (so-called TSVs, through-silicon vias), there would still remain issues with the supply connection to the upper chip, and with an adequate number of connections and an adequate thermal dissipation path from the upper chip to the substrate. In addition, TSVs through integrated circuit chips add significant cost and have to overcome problems with different coefficients of thermal expansion (CTE) between silicon and the metal in the TSVs.

A proposal has recently been made to avoid TSVs in integrated circuit chips by building a stacked device from units wherein each chip is flip-connected on an individual silicon interposer with TSVs. In order to integrate the building blocks, the interposers have a larger area than the chips so that they form overhangs over the chip areas; metal pillars can then provide the interconnection between the interposers and from the interposers to the substrate.

DETAILED DESCRIPTION OF THE PREFERRED EMBODIMENTS

Figure 1:
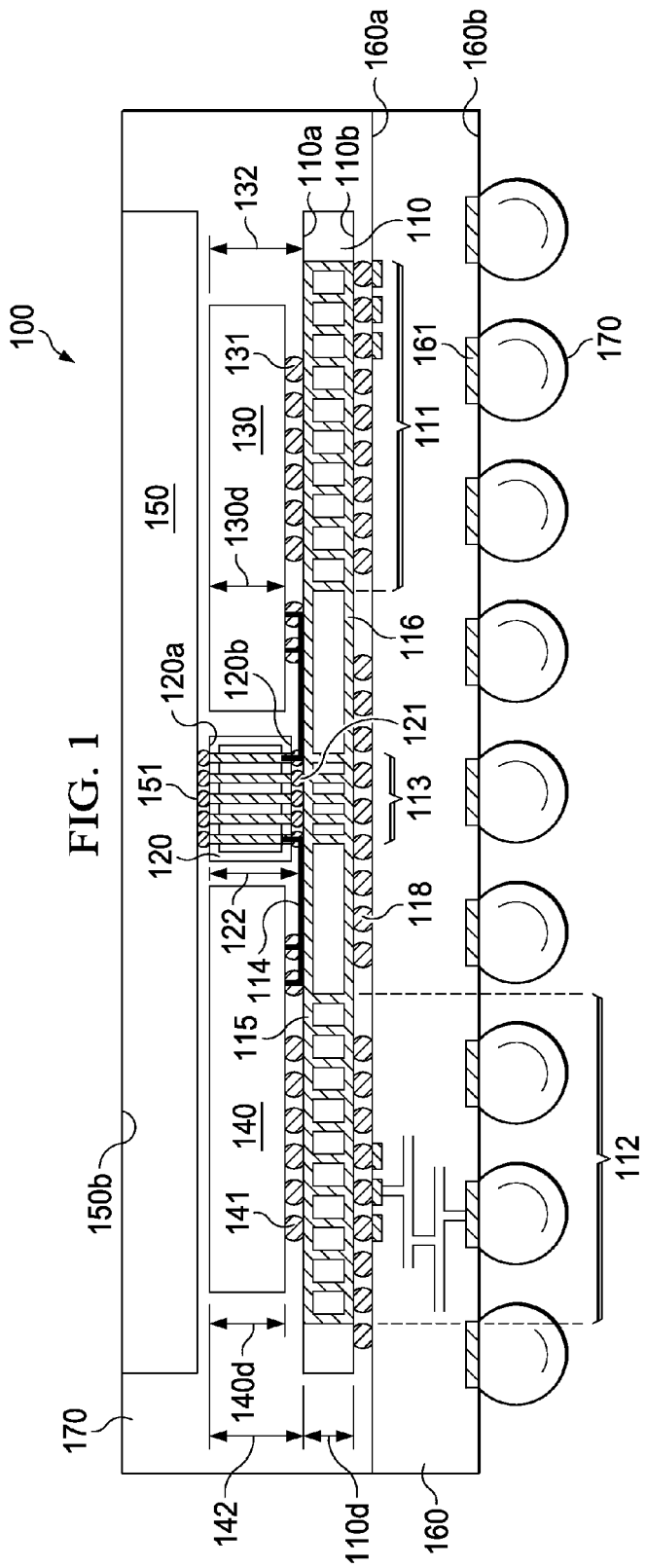
FIG. 1 illustrates a cross section of an exemplary embodiment of the invention showing two silicon interposers with TSVs for vertically stacking a standard memory chip to the chips of a split SOC architecture.

FIG. 1 illustrates an exemplary semiconductor device generally designated 100 as an embodiment of the invention. Device 100 includes a first silicon interposer 110, a second silicon interposer 120, a first semiconductor chip 130, a second semiconductor chip 140, and a third semiconductor chip 150. Device 100 further includes a substrate 160, and may also include a packaging compound 170 encapsulating the interposers 110 and 120, first chip 130 and second chip 140, and at least portions of third chip 150. The not-encapsulated surface 150b of third chip 150 may serve as an attachment site for a heat spreader or heat sink, promoting effective cooling of stacked device 100.

As FIG. 1 shows, first silicon interposer 110 has a thickness 110d, a first surface 110a and an opposite second surface 110b; thickness 110d is preferably 50 µm, but other interposers may be thicker of thinner. A plurality of through-silicon vias (TSVs) extend through first interposer 110 from the first surface 110a to the second surface 110b. The plurality of TSVs is arrayed in a first set 111, a second set 112, and a third set 113. In an exemplary arrangement, these sets are displayed in FIG. 2 for the case of a processor with split architecture and a standard memory. These examples, however, should not be construed in a limiting sense, since the large number of semiconductor device families offers numerous similar examples.

Figure 2:
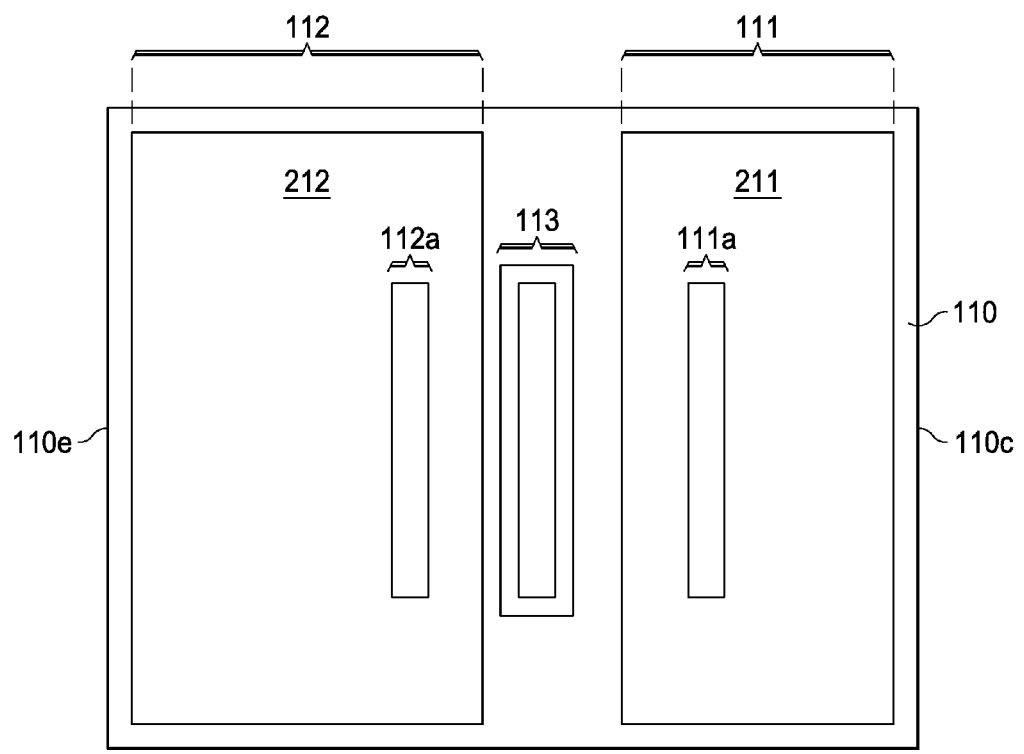
FIG. 2 is a top view of an exemplary first interposer, indicating the assembly sites for two chips having split architecture and a second interposer.

FIG. 2 indicates that adjacent TSVs are parallel to each other. At the interface to the semiconductor material, the side walls of each TSV are straight, but not necessarily parallel to each other; preferably, the TSV has a cylindrical shape, as shown in an enlargement of a TSV in FIG. 3. The sidewalls may in some embodiments have the shape of a truncated cone. In other embodiments, the cross section of the holes may be rectangular, hexagonal, or in any other outline compatible with the crystalline orientation of the semiconductor material. The diameter 301 of the etched TSV is preferably selected in the range from about 10 to 40 µm; a preferred choice is 25 µm.

Figure 3:
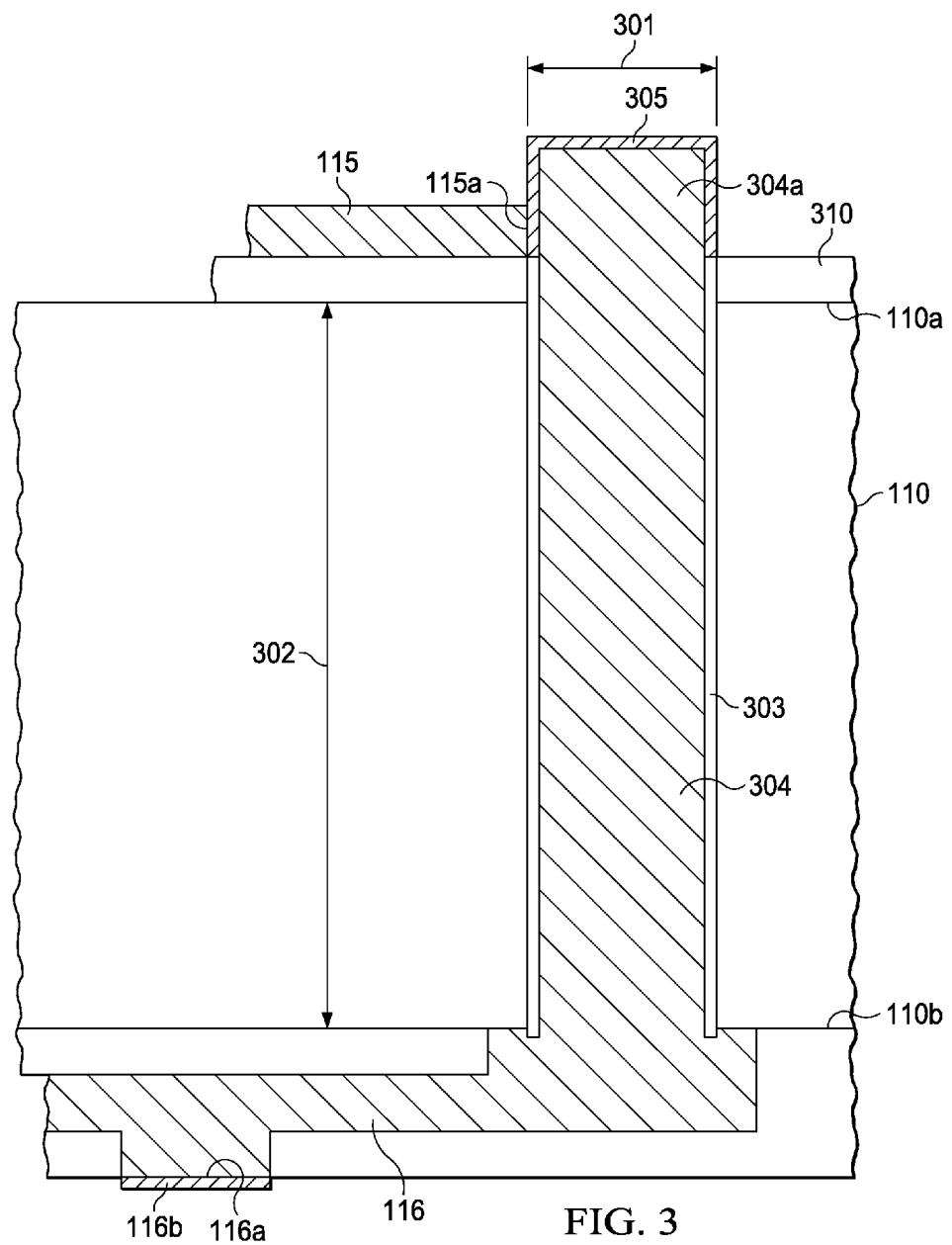
FIG. 3 shows a cutaway of a through-silicon-via (TSV) as a metal-filled via hole, extending from one surface to the opposite surface of a silicon wafer, together with portions of interconnecting surface 'traces.

A number of methods are practiced to fabricate a TSV as illustrated in FIG. 3: The via hole may be opened and filled as the first step in a process flow, or after conductive traces and some circuitry have been fabricated, or as the last step after fabricating conductive traces and circuitry. In a preferred method, the hole for a TSV is etched while the semiconductor material is still in wafer form, and has a depth 302 in the range from 70 to 150 µm. A dielectric compound such as silicon nitride or silicon dioxide is deposited on the TSV sidewalls after the etching step in order to create a thin (<1 µm) insulating liner 303 between the semiconductor material and the conductive compounds inside the TSV.

Thereafter, a metal seed layer is deposited (<1 µm thick) on the insulating layer (not shown in FIG. 3). The selection of the seed metal or metal compound depends on the choice of the metal for filling the TSV; a preferred seed metal is tantalum nitride. Then, the etched hole is filled with metal 304; a preferred filler metal is copper. The deposition of the filler metal may be performed before the wafer thinning (grinding) process or after the thinning step. Before filling (in some devices after filling) the via hole with metal, a network of patterned metal layer 116 is created, which provides interconnections on interposer surface 110b. Exposed portions 116a of metallization 116 may be made solderable by depositing a layer 116b of nickel followed by a layer of palladium or gold onto portions 116a.

The process step of thinning the wafer, by grinding or etching or both, continues until the bottom of the via hole is exposed and the deposited metal can be accessed. The thinning step may be continued for an additional short period of time to expose an end portion 304a of the filling metal 304; subsequently, end portion 304a may be covered with a solderable metal layer 305 such as nickel, palladium, gold, or a combination of these layers. The remaining semiconductor thickness 302 is preferably about 50 µm for some devices and 100 µm for other devices.

After the thinning step, the silicon wafer for fabricating the interposer is inverted so that the original surface 110b (referred to as second surface) becomes the bottom and an insulating layer 310 may be deposited on first surface 110a. For example, a polyimide compound may be used followed by patterned metal connection 115, which may, for instance, be made of copper or an eutectic gold-germanium alloy (12.5 weight % Ge, eutectic temperature 361° C.); conductive connections 115a provide an electrical contact to the TSVs. For creating connections in the assembly process, the solderable layers 305 and 116b, together with small amounts of solder of low melting temperature, from high-melting intermetallics so that the connections withstand temperature excursions and will not open up by re-flowing of solder.

FIG. 2 illustrates the top view of an exemplary first interposer 110 with rectangular shape; other first interposers may be square-shaped with exemplary side lengths of 10 mm by 10 mm, or 12 mm by 12 mm, or other dimensions. As illustrated in FIG. 2, the first TSV set 111 is located in a first interposer region 211, In FIG. 2 close to periphery 110c of the interposer. The TSVs are not individually shown in FIG. 2, but the TSVs of the first set 111 match the terminals of the first semiconductor chip 130; dependent on the device type, the number of TSVs may be several hundred to more than one thousand. First set 111 includes a sub-set 111a of TSVs (also not individually shown, may be more than one thousand), which matches the terminals of the memory I/Os of first chip 130. While for many device types sub-set 111a is centrally located within set 111, in the exemplary embodiment of FIG. 2 sub-set 111 is located off-center within set 111. In the exemplary embodiment, first chip 130 may be the high performance chip of the split TOC architecture, may have a thickness 130d of 50 µm, and be fabricated for instance by a relatively advanced semiconductor technology such as the 20 nm technology. In the exemplary embodiment, chip 130 may have a size 4 mm by 12 mm.

As FIG. 1 shows, the terminals of chip 130 are attached by solder bumps 131 to the matching TSVs of the set 111 on the first interposer surface 110a. Alternatively, copper pillars (for instance with 30 µm diameter) may be used instead of solder bumps. As commonly expressed, chip 130 is "flipped" on interposer 110; consequently, chip 130 is vertically stacked on the first surface 110a of first interposer 110. After the attachment by solder bumps, the height 132 of thickness 130d of first chip 130 together with the solder bumps is herein referred to as first height.

It is a technical advantage that first chip 130 may remain free of TSVs, a fact which avoids an otherwise significant cost adder.

As illustrated in FIG. 2, the second TSV set 112 is located in a second interposer region 212, which in FIG. 2 is close to interposer periphery 110e opposite the first TSV set 111. The TSVs are not individually shown in FIG. 2, but the TSVs of the second set 112 match the terminals of the second semiconductor chip 140; dependent on the device type, the number of TSVs may be several hundred to more than one thousand. Second set 112 includes a sub-set 112a of TSVs (also not individually shown, may be more than one thousand), which matches the terminals of the memory I/Os of second chip 140. As the exemplary embodiment of FIG. 2 illustrates, sub-set 112a does not have to be centrally located within set 112, but for many device types is indeed centrally located. In the exemplary embodiment, chip 140 may be the lower performance chip of the split TOO architecture, may have a thickness 140d of 50 µm, and be fabricated for instance by a relatively mature semiconductor technology such as the 28 nm technology. In the exemplary embodiment, chip 140 may have a size 6 mm by 12 mm.

As FIG. 1 shows, the terminals 141 of chip 140 are attached by solder bumps to the matching TSVs of the set 112 on the first interposer surface 110a. Alternatively, copper pillars may be used instead of solder bumps. As commonly expressed, chip 140 is "flipped" on interposer 110; consequently, chip 140 is vertically stacked on the first surface 110a of first interposer 110. After the attachment by solder bumps, the height 142 of thickness 140d of second chip 140 together with the solder bumps is herein referred to as second height.

It is a technical advantage that second chip 140 may remain free of TSVs, a fact which avoids an otherwise significant cost adder. Furthermore, it should be mentioned that, due to the high thermal conductivity of silicon, first interposer 110 helps the thermal dissipation of operational heat created by the chips, especially by the high performance chip 130.

As illustrated in FIG. 2, the third TSV set 113 is located between the first interposer region 211 and second interposer regions 212, preferably about in the middle of the interposer. More preferably, third set 113 is symmetrical between first set 111 and second set 112. The TSVs are not individually shown in FIG. 2 (may be more than one thousand), but the TSVs of the third set match the terminals of third semiconductor chip 150. In the exemplary embodiment, chip 150 may be a standard memory chip with terminals located preferably in the center region of the chip. The TSVs of the third set provide direct power and ground connections to the memory chip 150.

FIG. 1 indicates that the TSVs of the third set 113 have conductive traces 114 to TSVs of the first set 111 and of the second set 112 (traces not shown in FIG. 2). Traces 114 distribute memory interconnections to the terminals of first chip 130 and to the terminals of second chip 140. In the preferred embodiment, traces 114 take the shortest route to the respective TSVs of first chip 130 and second chip 140 so that IR losses and other parasitic losses are minimized. Additional traces integral with interposer 110 provide interconnections between chips 130 and 140.

In the preferred embodiment (see FIG. 1), second silicon interposer 120 has a an area of about 2 mm by 12 mm, and a height of 50 µm; this size is small compared to first interposer 110, which may have an exemplary area of 10 mm by 10 mm, or 12 mm by 12 mm. Second interposer 120 has a third surface 120a and an opposite fourth surface 120b. A plurality of through-silicon vias (TSVs) extend through second interposer 120 from the third surface 120a to the fourth surface 120b. The plurality of TSVs matches the terminals of third semiconductor chip 150. The ends on surface 120a and surface 120b of the TSVs through second interposer 120 are preferably solderable. The matching TSVs of the second interposer 120 are attached by solder bumps 121 to respective TSVs of the third set 113 on the first interposer surface 110a. Alternatively, copper pillars may be used instead of solder bumps. Consequently, interposer 120 is vertically stacked on the first surface 110a of interposer 110, giving first interposer 110 the characteristic of a three-dimensional (3D) interposer.

As FIG. 1 indicates, height 122 of second interposer 120 together with the solder bumps 121 for the attachment to first interposer 110 is at least as great as first height 132 and second height 142.

It is a technical advantage of the exemplary embodiment of FIG. 1 with second silicon interposer 120 that by using a standard memory chip 150 with JEDEC standard interface, the employment of a custom memory with two interfaces to the two chips 130 and 140 can be avoided; that approach would lead to unsolvable alignment accuracy issues.

It is another technical advantage of using a second (small) interposer connected to a first (large) interposer that the first interposer provides connection from the second interposer to the two chips (of split architecture) in parallel, further short distance connections between the chips, and further good supply connections to both chips, relieving IR issues. The stacking architecture may be symmetrical, avoiding unbalanced stress.

It is an additional technical advantage that the interposers, being made of silicon, provide improved heat dissipation, as well as the same coefficient of expansion as the chips and thus avoid thermo-mechanical stress.

The terminals of third chip 150, which is preferably a standard memory chip, are soldered, preferably by solder bumps 151, to the TSVs of second interposer 120. The additional height of the solder bumps together with height 122 (which is at least as great as height 132 and height 142) insures that chip 150 does not touch chip 130 or chip 140. As a result, third chip 150 is vertically stacked on second interposer 120, yet separate from chips 130 and 140. Further, third chip 150 may remain free of TSVs, avoiding an otherwise significant cost adder.

The ends of the TSVs of the first, second and third set are exposed on second surface 110b of first interposer 110. These TSV ends are preferably solderable and may be interconnected by patterned metal layer 116. Alternatively, the TSV of the first, second, and third set may end in solderable metal pads on surface 110b.

FIG. 1 indicates that device 100 further includes a substrate 160 made of insulating material and integral with conductive vertical and horizontal traces. For the exemplary device 100 of FIG. 1, the substrate may be square-shaped with a side length of 14 mm by 14 mm, or 16 mm by 16 mm. Substrate 160 preferably has solderable contact pads on its surface 160a facing second surface 110b of the first interposer. A plurality of these contact pads matches the ends of the TSVs through interposer 110 and the metal pads on the second surface 110b of the first interposer. As depicted in FIG. 1, solder bumps 118 connect the interposer TSVs ends and the metal pads on surface 110b with the substrate contact pads. Alternatively, copper pillars (for instance with 30 µm diameter) may be used for interconnecting. As a result, first interposer 110 is vertically stacked upon substrate 160.

Substrate 160 has on its surface 160b, which is opposite first interposer 110, contact pads 161 suitable for interconnection to external parts, including power supply and electrical ground. The number of solder bumps may high so that IR drop problems may be effectively avoided. As a preferred example, FIG. 1 depicts solder balls 170 as interconnecting means. Alternatively, pressure contacts may be used to connect to pads 161.

In the exemplary embodiment illustrated in FIG. 1, solder bumps are used for interconnecting chips and interposers; as mentioned, however, an alternative interconnection method employs copper pillars. When solder bumps are used, the reflow temperature of the solder compound selected for a certain process step should preferably be lower than the reflow temperature of the solder compound employed for the previous step so that the interconnections made in the previous assembly step would not re-melt. Consequently, in the preferred process flow, reflow temperature of bumps 151<reflow temperature of bumps 131, 141, and 121<reflow temperature of bumps 118. When solder bumps 170 are employed for connecting device 100 to external parts, preferably reflow temperature of bumps 170<reflow temperature of bumps 151.

When copper pillars are used, the amount of solder attached to the pillar tips and intended for interconnections is preferably kept so small that the solder compound is fully consumed to form intermetallics during the assembly process. Since re-melt temperatures of intermetallics are high, there is usually no risk of opening up previously formed connections during subsequent attachment steps.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the memory chip does not have to be a standard memory chip, by may be any memory chip. As another example, the interposers may be made of any material with a coefficient of thermal expansion (CTE) close to the CTE of the circuit chips.

As yet another example, the concept of a three-dimensional semiconductor interposer including a large-size and a small-size interposer can be applied to the assembly of any three circuit chips, wherein the small-size interposer is attached approximately in the middle of the large size interposer with two of the chips positioned approximately symmetrical to the small-size interposer.

It is therefore intended that the appended claims encompass any such modifications or embodiment.

We claim:
1. A method for fabricating a semiconductor device comprising:
   providing a first chip having a first terminals;
   providing a second chip having second terminals;
   providing a third chip having third terminals;

providing a first silicon interposer having first through silicon vias TSVs;
providing a second silicon interposer having second TSVs;
arraying the first TSVs in a first, a second, and a third set, wherein the first set is located in a first interposer region and matching the first terminals, the second set is located in a second interposer region and matching the second terminals, and the third set is located in a third interposer region between the first and second regions and matching the TSVs of the second interposer and the third terminals;
aligning the first chip with the first set TSVs, the second chip with the second set TSVs, and the second interposer with the third set TSVs;
giving the first silicon interposer a characteristic of a three-dimensional (3D) interposer by stacking the second silicon interposer on top of the first silicon interposer; and
using a solder of a first melting temperature.

2. The method of claim 1 wherein the first and the second chips are portions of a system-on-chip having a split architecture.

3. The method of claim 2 wherein the first chip includes the higher performance portion of the system-on-chip and the second chip the lower performance portion.

4. The method of claim 1 wherein the third chip is a standard memory chip.

5. The method of claim 1 wherein the first, second, and third chips are free of TSVs.

6. The method of claim 1, further comprising locating the third TSV set symmetrically between the first and the second region.

7. The method of claim 1, further comprising locating the conductive traces of the third set TSVs on the first surface of the first interposer.

8. The method of claim 1, further comprising providing solderable metal pads on the second surface of the first interposer for the TSVs of the first, second and third sets.

9. The method of claim 1, further comprising providing a substrate having on its surface facing the first interposer solderable contact pads matching the pads on the second surface of the first interposer.

10. The method of claim 9, further comprising providing a plurality of solder bumps connecting the first interposer to the substrate contact pads, wherein the first interposer is vertically stacked upon the substrate.

11. The method of claim 9 further comprising providing on the substrate surface opposite the first interposer, contact pads for interconnection to external parts including power and ground terminals.

12. The method of claim 1, further comprising:
providing first solderable ends on the first surface of the first TSVs and second solderable ends on the second surface of the first TSVs; and
providing third solderable ends on the third surface of the second TSVs and fourth solderable ends on the fourth surface of the second TSVs.

13. The method of claim 1, further comprising encapsulating the first, second and third chip, and the first and second interposer in a polymeric packaging compound.

\* \* \* \* \*